United States Patent
Ning et al.

(10) Patent No.: US 11,557,682 B1
(45) Date of Patent: Jan. 17, 2023

(54) LOW TURN-ON VOLTAGE GAN DIODES HAVING ANODE METAL WITH CONSISTENT CRYSTAL ORIENTATION AND PREPARATION METHOD THEREOF

(71) Applicant: XIDIAN UNIVERSITY, Shaanxi (CN)

(72) Inventors: Jing Ning, xi'an (CN); Chi Zhang, Xi'an (CN); Jincheng Zhang, Xi'an (CN); Boyu Wang, Xi'an (CN); Dong Wang, Xi'an (CN); Peijun Ma, Xi'an (CN); Yue Hao, Xi'an (CN)

(73) Assignee: XIDIAN UNIVERSITY, Xi'an (CN)

( * ) Notice: Subject to any disclaimer, the term of this patent is extended or adjusted under 35 U.S.C. 154(b) by 0 days.

(21) Appl. No.: 17/579,585

(22) Filed: Jan. 19, 2022

(51) Int. Cl.
| | |
|---|---|
| H01L 29/872 | (2006.01) |
| H01L 29/20 | (2006.01) |
| H01L 29/205 | (2006.01) |
| H01L 29/47 | (2006.01) |
| H01L 21/02 | (2006.01) |
| H01L 21/285 | (2006.01) |
| H01L 21/306 | (2006.01) |
| H01L 21/3213 | (2006.01) |
| H01L 29/66 | (2006.01) |

(52) U.S. Cl.
CPC ...... *H01L 29/872* (2013.01); *H01L 21/02057* (2013.01); *H01L 21/02164* (2013.01); *H01L 21/28581* (2013.01); *H01L 21/30621* (2013.01); *H01L 21/32136* (2013.01); *H01L 29/2003* (2013.01); *H01L 29/205* (2013.01); *H01L 29/475* (2013.01); *H01L 29/66143* (2013.01)

(58) Field of Classification Search
CPC ............. H01L 29/66212; H01L 29/872; H01L 29/66143; H01L 29/475
See application file for complete search history.

(56) References Cited

U.S. PATENT DOCUMENTS

| | | | |
|---|---|---|---|
| 2012/0228626 A1* | 9/2012 | Mochizuki | ............ H01L 29/872 257/E29.091 |
| 2015/0137135 A1* | 5/2015 | Green | .................. H01L 21/0272 438/237 |
| 2021/0305404 A1* | 9/2021 | Drowley | ........... H01L 29/66462 |

* cited by examiner

*Primary Examiner* — John A Bodnar
(74) *Attorney, Agent, or Firm* — Robert J. Hess; Hess Patent Law Firm

(57) ABSTRACT

A low turn-on voltage GaN diode having an anode metal with a consistent crystal orientation and a preparation method thereof. The low turn-on voltage GaN diode having an anode metal with a consistent crystal orientation provided by the present disclosure includes a substrate layer, a GaN buffer layer, a GaN channel layer and an AlGaN barrier layer, which are arranged in sequence from bottom to top; a cathode arranged on the AlGaN barrier layer; a groove arranged in the GaN channel layer and the AlGaN barrier layer, and an anode provided on a bottom and a side wall of the groove and part of the AlGaN barrier layer; a dielectric layer provided on an uncovered portion of the AlGaN barrier layer; wherein, a contact portion of the anode with the groove and the AlGaN barrier layer is W or Mo metal with a crystal orientation of <100>.

3 Claims, 6 Drawing Sheets

LOW TURN-ON VOLTAGE GAN DIODES HAVING ANODE METAL WITH CONSISTENT CRYSTAL ORIENTATION AND PREPARATION METHOD THEREOF

TECHNICAL FIELD

The present disclosure belongs to the field of microelectronics, and specifically relates to a low turn-on voltage gallium nitride (GaN) diode having an anode metal with a consistent crystal orientation and a preparation method thereof.

BACKGROUND ART

GaN has advantages of large band gap, direct band gap, high breakdown field strength, and high thermal conductivity, as well as excellent electrical and optical properties in harsh environments, so it has been widely used in power electronic devices and other fields, and the main application is diodes and high-electron-mobility transistors (HEMTs). However, due to the material properties of GaN, when GaN material is used in diode devices, the Schottky barrier of the device is high due to the large difference of the work function between GaN material and metal, which leads to the higher opening voltage of GaN diode compared with the diode prepared by traditional materials, thereby greatly affecting its efficiency.

The traditional aluminum gallium nitride (AlGaN)/GaN structure-based diodes mostly use Pt and AlGaN layer to achieve Schottky contact. Due to the high barrier, the turn-on voltage of the device is more than 1 V, which makes it limited in low-power rectification and other fields. Therefore, the preparation of GaN diodes with a low turn-on voltage can greatly improve the performance of the device, which is of great use significance.

SUMMARY

In order to solve the above problems in the prior art, the present disclosure provides a low turn-on voltage GaN diode having an anode metal with a consistent crystal orientation and a preparation method thereof. The technical problem to be solved by the present disclosure is realized through the following technical schemes:

The present disclosure provides a low turn-on voltage GaN diode having an anode metal with a consistent crystal orientation comprising:

A substrate layer, a GaN buffer layer, a GaN channel layer and an AlGaN barrier layer which are arranged in sequence from bottom to top;

A cathode arranged on the AlGaN barrier layer;

A groove arranged in the GaN channel layer and the AlGaN barrier layer, and an anode provided on a bottom and a side wall of the groove and part of the AlGaN barrier layer;

A dielectric layer provided on an uncovered portion of the AlGaN barrier layer;

Wherein, a contact portion of the anode with the groove and the AlGaN barrier layer is tungsten (W) or molybdenum (Mo) metal with a crystal orientation of <100>.

In an embodiment of the present disclosure, the bottom of the groove is located 2-20 nm below the interface between the AlGaN barrier layer and the GaN channel layer.

In an embodiment of the present disclosure, the anode is a stack of W or Mo metal with a thickness of 20-120 nanometers (nm) and Au metal with a thickness of 100-200 nm.

In an embodiment of the present disclosure, the dielectric layer is a $SiO_2$ dielectric layer with a thickness of 100-300 nm.

The present disclosure also provides a method for preparing a low turn-on voltage GaN diode having an anode metal with a consistent crystal orientation, wherein comprising steps of:

S1: cleaning an epitaxial wafer of an AlGaN/GaN structure;

S2: preparing a mesa isolation on the epitaxial wafer;

S3: depositing a titanium (Ti)/aluminum (Al)/nickel (Ni)/gold (Au) metal stack on the epitaxial wafer to form a cathode of a diode;

S4: etching an AlGaN barrier layer and a GaN channel layer to below an AlGaN/GaN interface to form a groove, depositing a stack of W or Mo metal and Au metal in the groove and on a part of the AlGaN barrier layer to form an anode of the diode, wherein a contact portion of the anode with the groove and the AlGaN barrier layer is W or Mo metal with a crystal orientation of <100>;

S5: depositing a silicon dioxide ($SiO_2$) dielectric layer on an uncovered portion of the epitaxial wafer, and etching a through-hole region to a cathode metal surface using an reactive ion etching (ME) machine.

In an embodiment of the present disclosure, step S2 includes:

S21: performing spin coating, baking, photolithography and development on the cleaned epitaxial wafer;

S22: etching an outside portion of a GaN mesa using inductively coupled plasma (ICP);

S23: placing the etched epitaxial wafer into an acetone solution and an isopropanol solution in sequence, performing ultrasonic cleaning, and then drying with nitrogen to form a device mesa isolation.

In an embodiment of the present disclosure, the step S3 includes:

S31: performing spin coating, baking, photolithography and development on a mesa-isolated epitaxial wafer;

S32: depositing the Ti/Al/Ni/Au metal stack on the epitaxial wafer using an electron beam evaporation equipment;

S33: soaking the epitaxial wafer deposited with the metal stack in an acetone solution to strip metals outside the cathode metal, then placing the stripped epitaxial wafer into the acetone solution and an isopropanol solution in sequence, performing ultrasonic cleaning, and then drying with nitrogen and annealing in a rapid annealing furnace to form the cathode of the diode.

In an embodiment of the present disclosure, step S4 includes:

S41: performing spin coating, baking, photolithography and development on the epitaxial wafer with the cathode;

S42: etching the AlGaN barrier layer and the GaN channel layer to 2-20 nm below the AlGaN/GaN interface using an ICP etching machine to form a groove;

S43: depositing W or Mo metal with a crystal orientation of <100>and a thickness of 2-20 nm in the groove and on a part of the AlGaN barrier layer using a molecular beam epitaxy technology, depositing W or Mo metal with a thickness of 20-100 nm on W or Mo metal with a crystal orientation of <100>using an electron beam evaporation equipment, and depositing Au metal with a thickness of 100-200 nm on W or Mo metal to form the stack of W or Mo metal and Au metal;

S44: soaking the epitaxial wafer deposited with the metal stack in an acetone solution to strip the metal outside the anode metal, then placing the stripped epitaxial wafer into the acetone solution and an isopropanol solution in sequence, performing ultrasonic cleaning, and then drying with nitrogen to form the anode of the diode.

In an embodiment of the present disclosure, step S5 includes:

S51: depositing a $SiO_2$ dielectric layer with a thickness of 100-300 nm on the uncovered portion of the epitaxial wafer using a plasma enhanced chemical vapor deposition equipment;

S52: performing spin coating, baking, through-hole photolithography and development on the epitaxial wafer with the dielectric layer in sequence, and etching the through-hole region to the surface of the cathode metal using an RIE etching machine;

S53: placing the etched epitaxial wafer into an acetone solution and an isopropanol solution in sequence, performing ultrasonic cleaning, and then drying with nitrogen to form the low-turn-on voltage GaN diode.

Compared with the prior art, the present disclosure has the following benefits:

1. The low turn-on voltage GaN diode having an anode metal with a consistent crystal orientation of the present disclosure uses W or Mo metal with a crystal orientation of <100>as the anode metal, which has better work function matching compared with anode metals with mixed crystal orientations. As a result, a Schottky contact with a smaller barrier is formed, and the diode has a smaller turn-on voltage.

2. The low turn-on voltage GaN diode having an anode metal with a consistent crystal orientation of the present disclosure uses W or Mo metal with a crystal orientation of <100>as the anode metal. Compared with the anode metal with mixed crystal orientations, the lattice mismatch constant with GaN is smaller.

The above description is only an overview of the technical scheme of the present disclosure. In order to understand the technical means of the present disclosure more clearly, it can be implemented in accordance with the content of the specification, and in order to make the above and other objectives, features and advantages of the present disclosure more obvious and understandable, the following will specifically cite preferred embodiments in conjunction with the accompanying drawings, which are described in detail as follows.

Figure 1:
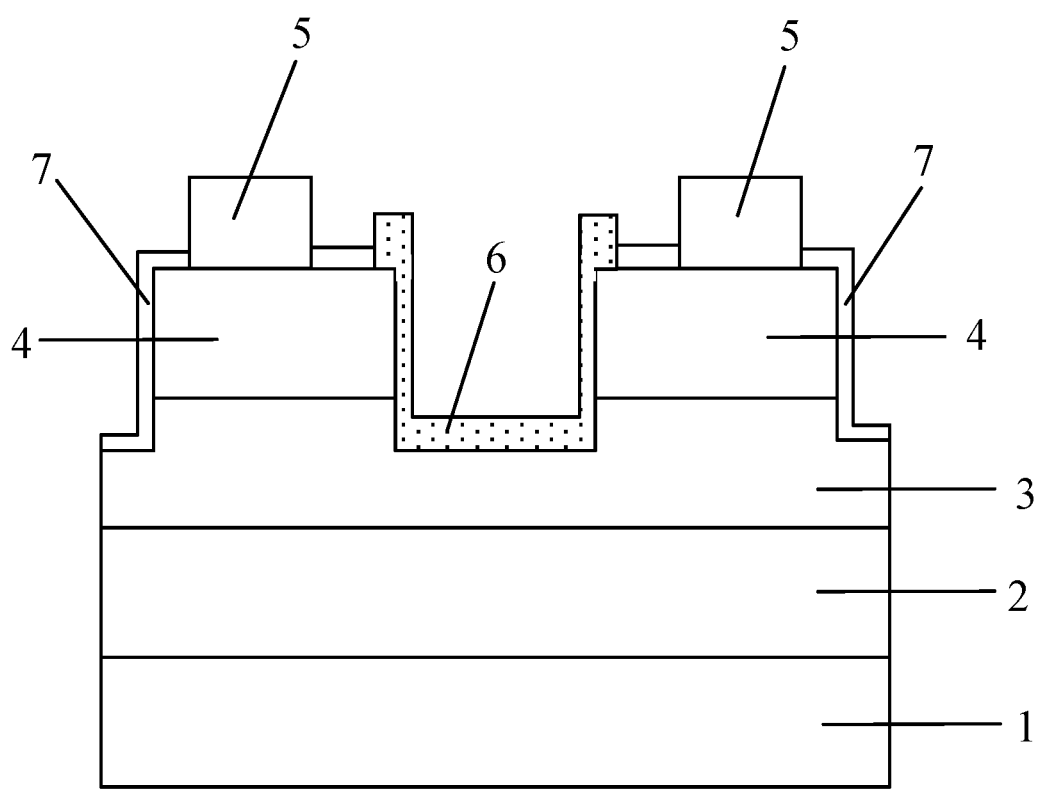
FIG.1 is a schematic structural diagram of a low turn-on voltage GaN diode having an anode metal with a consistent crystal orientation provided by an embodiment of the present disclosure.

Reference numerals: 1-substrate layer; 2-GaN buffer layer; 3-GaN channel layer; 4-AlGaN barrier layer; 5-cathode; 6-anode; 7-dielectric layer.

DETAILED DESCRIPTION OF THE EMBODIMENTS

In order to further explain the technical means and effects adopted by the present disclosure to achieve the intended purpose of the present disclosure, the following is combined with the accompanying drawings and specific implementation manners to carry out a low turn-on voltage GaN diode having an anode metal with a consistent crystal orientation and a preparation method thereof according to the present disclosure will be described in detail.

The foregoing and other technical content, features, and effects of the present disclosure can be clearly presented in the detailed description of the specific embodiments below in conjunction with the accompanying drawings. Through the description of the specific embodiments, the technical means and effects of the present disclosure to achieve the intended purpose can be understood more deeply and specifically. However, the attached drawings are only for reference and description, and are not used to limit the technical schemes of the present disclosure.

Example 1

A schematic structural diagram of a low turn-on voltage GaN diode having an anode metal with a consistent crystal orientation according to an embodiment of the present disclosure is shown in FIG. 1. As shown in FIG. 1, the low turn-on voltage GaN diode having an anode metal with a consistent crystal orientation in this embodiment is prepared on an AlGaN/GaN epitaxial wafer. The AlGaN/GaN epitaxial wafer includes a substrate layer 1, a GaN buffer layer 2, a GaN channel layer 3, and a AlGaN barrier layer 4 which are sequentially arranged from bottom to top, wherein the AlGaN barrier layer 4 is provided with a cathode 5, and the GaN channel layer 3 and the AlGaN barrier layer 4 are provided with a groove. An anode 6 is provided on a bottom and sidewalls of the groove and a part of the AlGaN barrier layer 4; and a dielectric layer 7 is provided on the uncovered portion of the AlGaN barrier layer 4.

Preferably, the contact portion of the anode 6 with the groove and the AlGaN barrier layer 4 is W or Mo metal with a crystal orientation of <100>. Using W or Mo metal with a crystal orientation of <100>as the anode metal, it has a better work function matching than that of the anode metal with a mixed crystal orientation, thereby forming a Schottky contact with a smaller barrier, and the diode has a smaller turn-on voltage. Moreover, using W or Mo metal with a crystal orientation of <100>as the anode metal, the lattice mismatch constant with GaN is smaller than that of the anode metal with a mixed crystal orientation. In general, the larger the surface energy, the smaller the work function. We can judge the size of the work function by analyzing the size of the surface energy, and the surface energy of each surface atom increases with the increase of surface roughness. Surface energy is estimated as the energy required to cut a bond to a nearest neighbor multiplied by the number of nearest neighbors. We use "bond" to represent the total bond strength formed due to the occupied d orbitals between two atoms. For metals with a bcc (body-centered cube) structure (Mo, W mentioned in the present disclosure), the distance of 8 nearest neighbors (NN) is not much shorter than the distance of 6 next-nearest neighbors (NNN). Two NN bonds and two NNN bonds need to be cut on the bcc (110) surface, while four NN bonds and one NNN bond need to be cut on the rough bcc (100) surface. If only NN bonds are considered, a ratio of surface energies of (100) and (110) should be 2.0, while the ratio of surface energies of (100) and (110) of Mo in the actual measurement is 1.5 (less than 2.0 because fewer NNN bonds are cut on the rough (100) surface). But in general, rough (100) surfaces have larger surface energy, i.e., smaller work function, than other surfaces. The smaller work function of metal is more conducive to the formation of Schottky contact with GaN.

In this example, the bottom of the groove is located 2-20 nm below an interface between the AlGaN barrier layer 4 and the GaN channel layer 3. The anode 6 is a stack of W or Mo metal with a thickness of 20-120 nm and Au metal with a thickness of 100-200 nm. The dielectric layer 7 is a $SiO_2$ dielectric layer with a thickness of 100-300 nm.

Example 2

Figure 2:
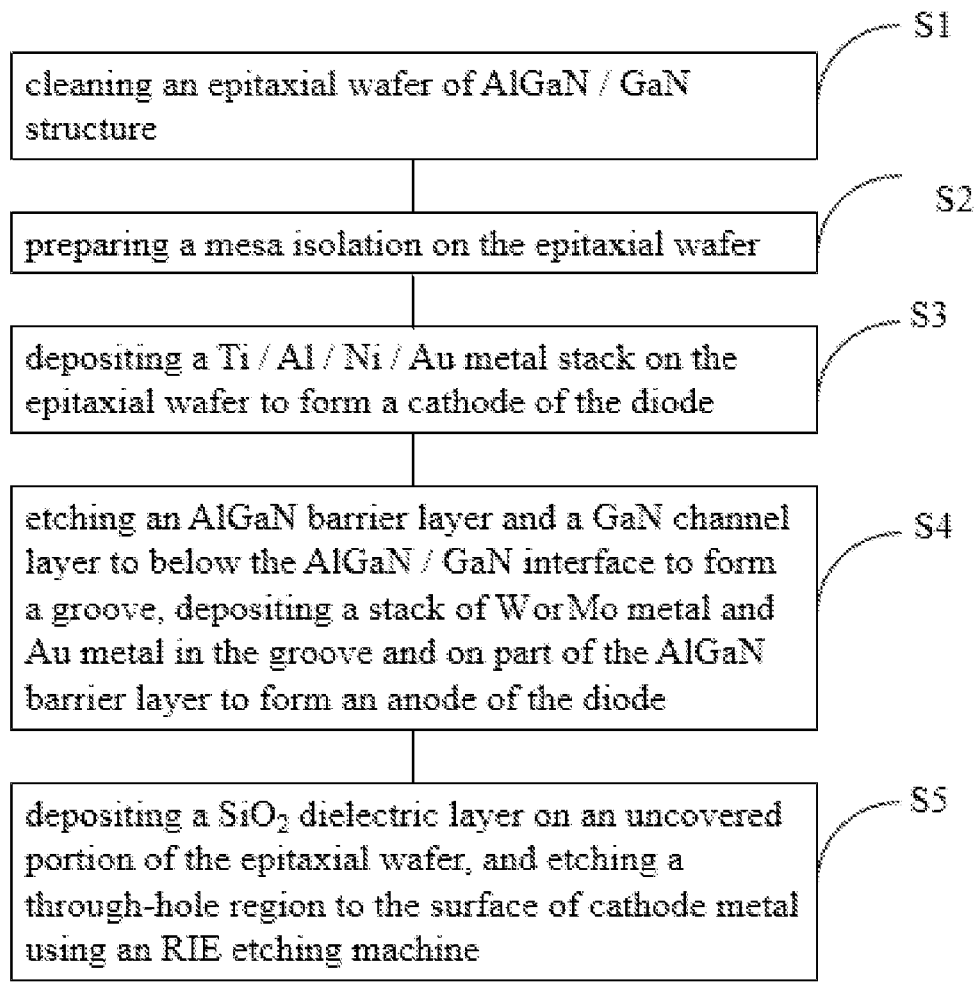
FIG.2 is a flowchart of a method for preparing a low turn-on voltage GaN diode having an anode metal with a consistent crystal orientation provided by an embodiment of the present disclosure.

This example provides a method for preparing a low-turn-on voltage GaN diode having an anode metal with a consistent crystal orientation, as shown in FIG. 2. FIG. 2 is a flowchart of the method for preparing a low-turn-on voltage GaN diode having an anode metal with a consistent crystal orientation provided by the embodiment of the present disclosure, which comprises steps of:

S1: Cleaning the epitaxial wafer of AlGaN/GaN structure;

Specifically, the epitaxial wafer with the AlGaN/GaN structure is sequentially placed in an acetone solution and an isopropanol solution, ultrasonically cleaned, and then dried with nitrogen.

S2: Preparing a mesa isolation on the epitaxial wafer;

Specifically, step S2 includes:

S21: Performing spin coating, baking, photolithography and development on the cleaned epitaxial wafer;

S22: Etching an outside portion of the GaN mesa using ICP;

S23: Placing the etched epitaxial wafer into an acetone solution and an isopropanol solution in sequence, performing ultrasonic cleaning, and then drying with nitrogen to form a device mesa isolation.

S3: Depositing a Ti/Al/Ni/Au metal stack on the epitaxial wafer to form a cathode of the diode;

Specifically, S3 includes:

S31: Performing spin coating, baking, photolithography and development on the epitaxial wafer forming the mesa isolation;

S32: Depositing a Ti/Al/Ni/Au metal stack on the epitaxial wafer using an electron beam evaporation equipment;

S33: Soaking the epitaxial wafer deposited with the metal stack in an acetone solution to strip the metal outside the cathode metal, then placing the stripped epitaxial wafer into an acetone solution and an isopropanol solution in sequence, performing ultrasonic cleaning, and then drying with nitrogen and annealing in a rapid annealing furnace to complete the preparation of the cathode of the diode.

S4: Etching an AlGaN barrier layer and a GaN channel layer to below the AlGaN/GaN interface to form a groove, and depositing a stack of W or Mo metal and Au metal in the groove and on part of the AlGaN barrier layer to form an anode of the diode, wherein a contact portion of the anode with the groove and the AlGaN barrier layer is W or Mo metal with a crystal orientation of <100>;

Specifically, step S4 includes:

S41: Performing spin coating, baking, photolithography and development on the epitaxial wafer with the cathode;

S42: Etching the AlGaN barrier layer and the GaN channel layer to 2-20 nm below the AlGaN/GaN interface using an ICP etching machine to form a groove;

S43: Depositing W or Mo metal with a crystal orientation of <100>and a thickness of 2-20 nm in the groove and on part of the AlGaN barrier layer using a molecular beam epitaxy technology, depositing W or Mo metal with a thickness of 20-100 nm on W or Mo metal with a crystal orientation of <100>using an electron beam evaporation equipment, and depositing Au metal with a thickness of 100-200 nm on W or Mo metal to form a stack of W or Mo metal and Au metal;

S44: Soaking the epitaxial wafer deposited with the metal stack in an acetone solution to strip the metal outside the anode metal, then placing the stripped epitaxial wafer into an acetone solution and an isopropanol solution in sequence, performing ultrasonic cleaning, and then drying with nitrogen to complete the preparation of the anode of the diode.

In this example, the anode metal forms a Schottky contact with GaN.

S5: Depositing a $SiO_2$ dielectric layer on an uncovered portion of the epitaxial wafer, and etching a through-hole region to the cathode metal surface using an RIE etching machine.

Specifically, step S5 includes:

S51: Depositing a $SiO_2$ dielectric layer with a thickness of 100-300 nm on the uncovered portion of the epitaxial wafer using a plasma enhanced chemical vapor deposition equipment;

S52: Performing spin coating, baking, through-hole photolithography and development on the epitaxial wafer with the dielectric layer in sequence, and etching the through-hole region to the surface of the cathode metal using an RIE etching machine;

S53: Placing the etched epitaxial wafer into an acetone solution and an isopropanol solution in sequence, performing ultrasonic cleaning, and then drying with nitrogen to complete the preparation of a low-turn-on voltage GaN diode.

In the preparation method of this example, W or Mo metal with a crystal orientation of <100>is selected as the anode metal of the diode, which forms Schottky contact with GaN. Compared with the anode metal with a mixed crystal orientation, the lattice mismatch constant between W or Mo metal with crystal orientation of <100>and GaN is smaller, which can relieve the stress caused by the lattice mismatch between the GaN side and the metal, thereby forming a Schottky contact with a smaller barrier, so that the diode has a smaller turn-on voltage.

Furthermore, the following two specific examples are given based on the preparation method of the low-turn-on voltage GaN diode having an anode metal with a consistent crystal orientation, shown as in FIG. 3a-FIG. 3f, which show the flow chart for the preparation of the low turn-on voltage GaN diode having an anode metal with a consistent crystal orientation.

A GaN diode device using W metal with a crystal orientation of <100>as the anode metal is prepared.

Step 1. Cleaning the epitaxial wafer

Figure 3A:
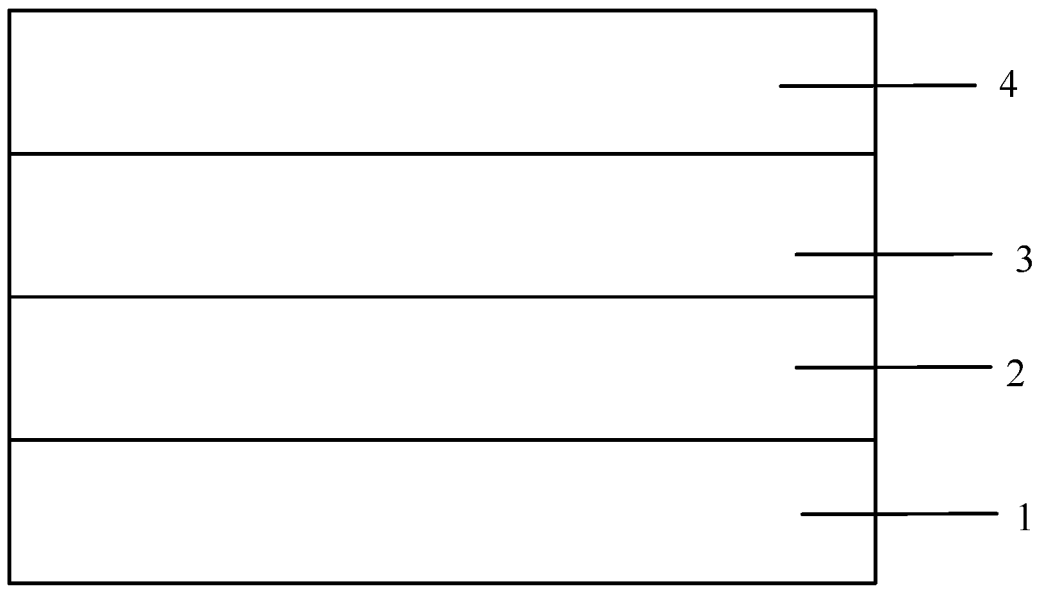
FIG. 3a-FIG. 3f show progressive views in the preparation of a low turn-on voltage GaN diode having an anode metal with a consistent crystal orientation provided by an embodiment of the present disclosure.

First, the AlGaN/GaN structure epitaxial wafer is sequentially placed in an acetone solution and an isopropanol solution, each is ultrasonically cleaned for 5 min, and then dried with nitrogen, as shown in FIG. 3a.

Step 2. Preparation of the mesa isolation

Figure 3B:

The cleaned epitaxial wafer is subjected to spin coating, baking, photolithography and development; then the area outside the GaN mesa is etched using ICP; then the etched epitaxial wafer is placed into acetone solution and isopropanol solution in sequence, each is ultrasonically cleaned for 5 min, and finally dried with nitrogen to form device mesa isolation, as shown in FIG. 3b.

Step 3. Preparation of cathode metal.

Figure 3C:
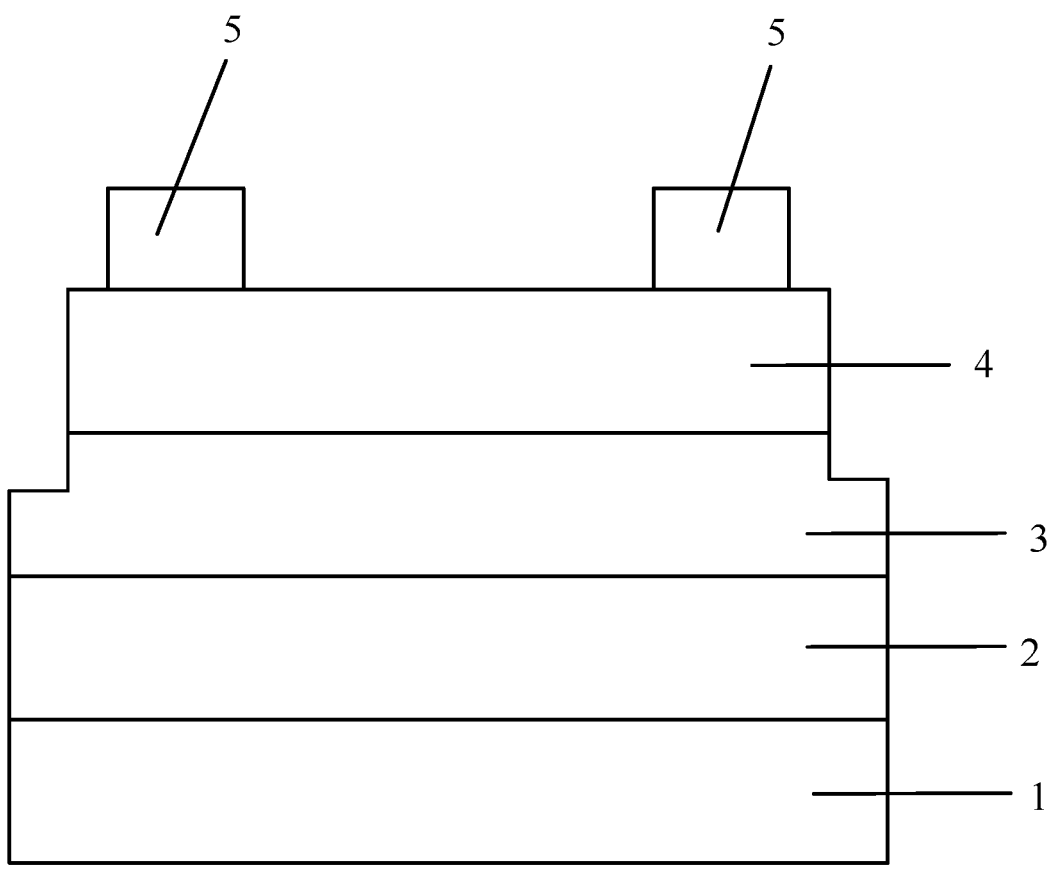

The etched epitaxial wafer is subjected to spin coating, baking, photolithography and development; then Ti/Al/Ni/Au metal stack is deposited on the epitaxial wafer using an electron beam evaporation equipment; then the epitaxial wafer deposited with the metal stack is soaked in acetone solution to strip the metal outside the cathode metal, the stripped epitaxial wafer is placed into acetone solution and isopropanol solution in sequence, each is ultrasonically cleaned for 5 min, then dried with nitrogen; and finally the epitaxial wafer is placed in a rapid annealing furnace for annealing to form the cathode of the device to complete the preparation of the diode cathode, as shown in FIG. 3c.

Step 4. Preparation of anode metal

Figure 3D:
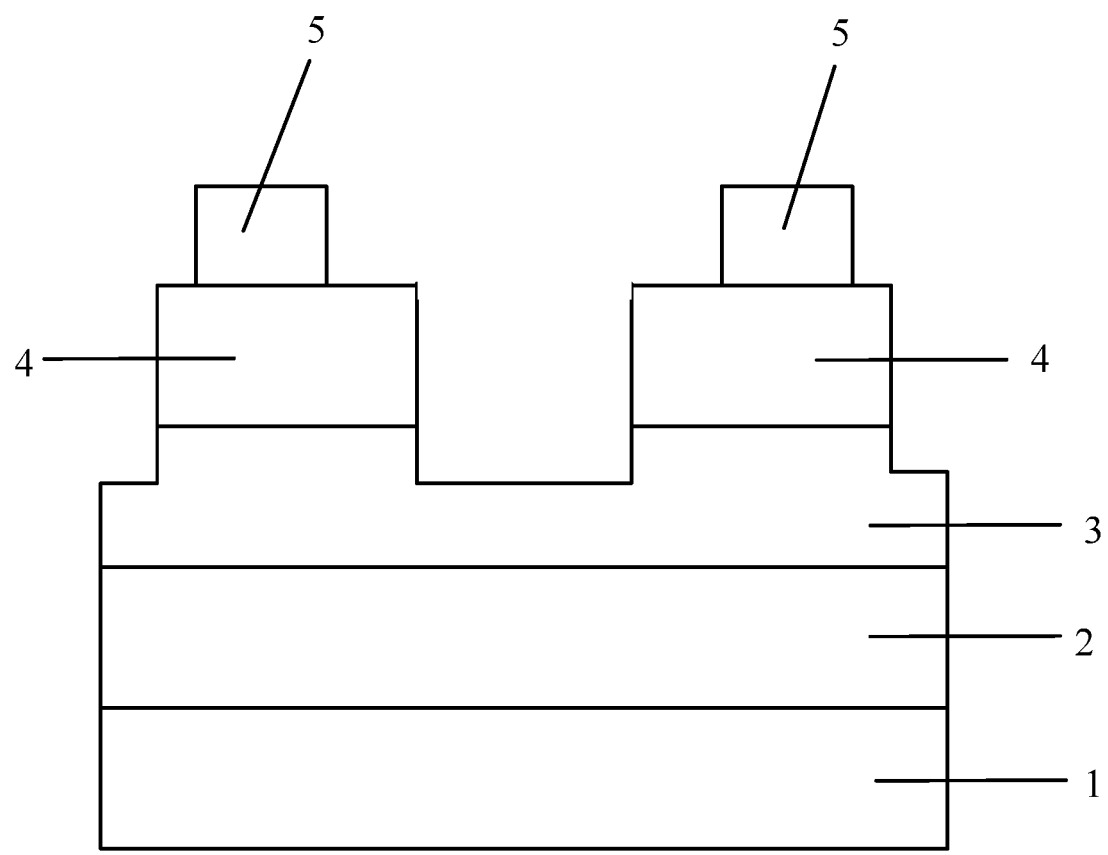
Figure 3E:
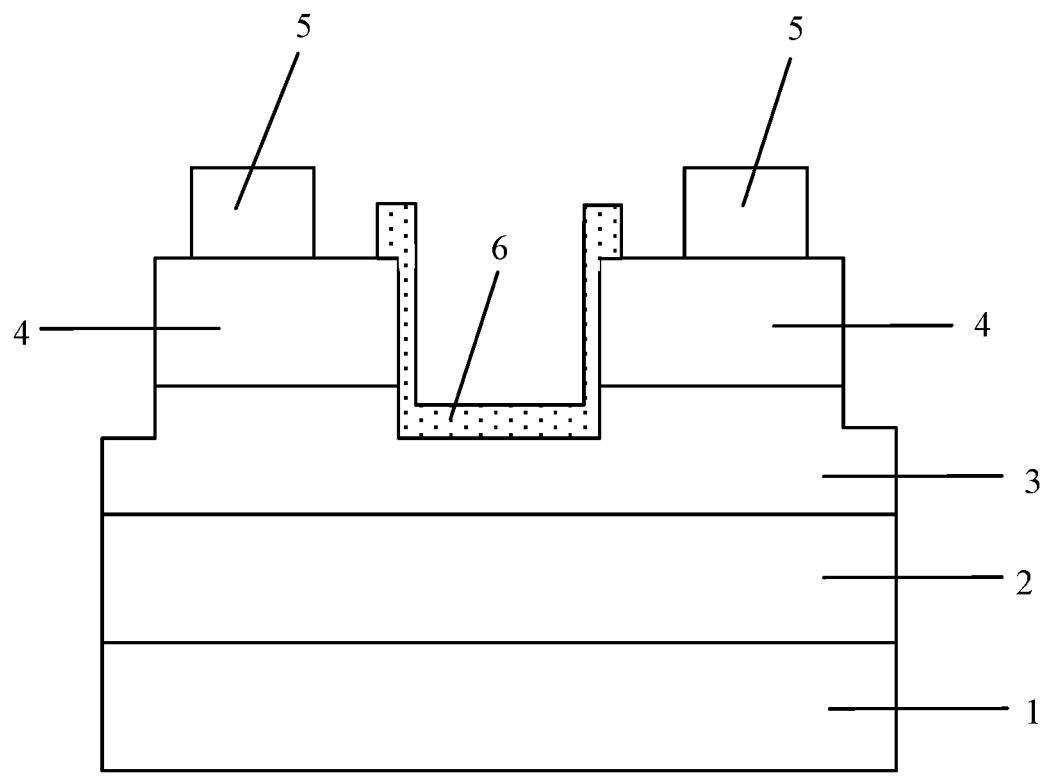

First, the epitaxial wafer with the cathode deposited is subjected to spin coating, baking, photolithography and development; then the AlGaN barrier layer and GaN channel layer are etched to 2 nm below the AlGaN/GaN interface using the ICP etching machine to form a groove, as shown in FIG. 3d;

W metal with a crystal orientation of <100>and a thickness of 2 nm is deposited using a molecular beam epitaxy technology, then W metal with a thickness of 20 nm is deposited on the W metal with a crystal orientation of <100>using an electron beam evaporation equipment, and then metal Au with a thickness of 100 nm is deposited to form a W/Au metal stack, as shown in FIG. 3e;

Finally, the epitaxial wafer deposited with the metal stack is soaked in acetone solution to strip the metal outside the anode metal, and then the stripped epitaxial wafer is placed in acetone solution and isopropanol solution in sequence, each is ultrasonically cleaned for 5 min, and then dried with nitrogen to complete the preparation of the anode of the diode.

Step 5. Dielectric layer deposition and through-hole opening

Figure 3F:
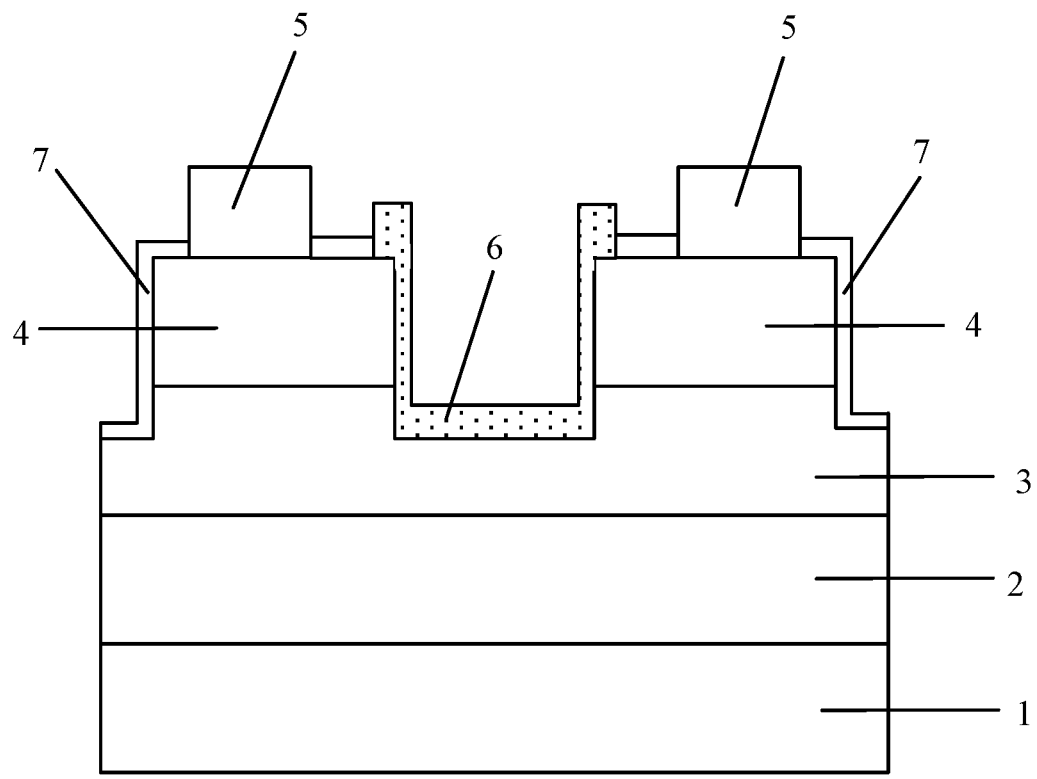

First, $SiO_2$ dielectric layer with a thickness of 100 nm is deposited on the epitaxial wafer deposited with the anode using a plasma enhanced chemical vapor deposition equipment, then the epitaxial wafer is subjected to spin coating, baking, through-hole lithography and development, the through-hole region is etched to the surface of the cathode metal, then the etched epitaxial wafer is placed into acetone solution and isopropanol solution in sequence, each is ultrasonically cleaned for 5 min, and then dried with nitrogen to complete the preparation of the GaN diode, as shown in FIG. 3f. Wherein, the process conditions for etching the $SiO_2$ dielectric layer are as follows: gas flow of carbon tetrafluoride ($CF_4$): 15 sccm (standard cubic centimeter per minute); gas flow of trifluoromethane ($CHF_3$): 20 sccm; RF power: 100 W (watts); reaction chamber pressure: 500 mTorr. The process conditions for etching the GaN buffer layer and AlGaN barrier layer are as follows: gas flow of $BCl_3$: 75 sccm; RF power: 40 W; and reaction chamber pressure: 40 mTorr (millitorr).

A GaN diode device using W metal with a crystal orientation of <100>as the anode metal is prepared.

Step 1. Cleaning the epitaxial wafer

First, the AlGaN/GaN structure epitaxial wafer is sequentially placed in an acetone solution and an isopropanol solution, each is ultrasonically cleaned for 5 min, and then dried with nitrogen, as shown in FIG. 3a.

Step 2. Preparation of the mesa isolation

The cleaned epitaxial wafer is subjected to spin coating, baking, photolithography and development; then the area outside the GaN mesa is etched using ICP; then the etched epitaxial wafer is placed into acetone solution and isopropanol solution in sequence, each is ultrasonically cleaned for 5 min, and finally dried with nitrogen to form device mesa isolation, as shown in FIG. 3b.

Step 3. Preparation of cathode metal.

The etched epitaxial wafer is subjected to spin coating, baking, photolithography and development; then Ti/Al/Ni/Au metal stack is deposited on the epitaxial wafer using an electron beam evaporation equipment; then the epitaxial wafer deposited with the metal stack is soaked in acetone solution to strip the metal outside the cathode metal, and then the stripped epitaxial wafer is placed into acetone solution and isopropanol solution in sequence, each is ultrasonically cleaned for 5 min, and then dried with nitrogen; and finally the epitaxial wafer is placed in a rapid annealing furnace for annealing to form the cathode of the device to complete the preparation of the diode cathode, as shown in FIG. 3c.

Step 4. Preparation of anode metal

First, the epitaxial wafer with the cathode deposited is subjected to spin coating, baking, photolithography and development;

Then, the AlGaN barrier layer and GaN channel layer are etched to 2 nm below the AlGaN/GaN interface using the ICP etching machine to form a groove, as shown in

FIG. 3d;

Then, Mo metal with a crystal orientation of <100>and a thickness of 20 nm is deposited using a molecular beam epitaxy technology, then Mo metal with a thickness of 100 nm is deposited on the Mo metal with a crystal orientation of <100>using an electron beam evaporation equipment, and metal Au with a thickness of 200 nm is deposited to form a Mo/Au metal stack, as shown in FIG. 3e;

Finally, the epitaxial wafer deposited with the metal stack is soaked in acetone solution to strip the metal outside the anode metal, then the stripped epitaxial wafer is placed in acetone solution and isopropanol solution in sequence, each is ultrasonically cleaned for 5 min, and then dried with nitrogen to complete the preparation of the anode of the diode.

Step 5. Dielectric layer deposition and through-hole opening.

First, $SiO_2$ dielectric layer with a thickness of 300 nm is deposited on the epitaxial wafer deposited with the anode using a plasma enhanced chemical vapor deposition equipment;

Then, the epitaxial wafer is subjected to spin coating, baking, through-hole lithography and development, and the through-hole region is etched to the surface of the cathode metal;

Finally, the etched epitaxial wafer is placed into acetone solution and isopropanol solution in sequence, each is ultrasonically cleaned for 5 min, and then dried with nitrogen to complete the preparation of the GaN diode, as shown in FIG. 3f.

Wherein, the process conditions for etching the $SiO_2$ dielectric layer are as follows: gas flow of $CF_4$: 25 sccm; gas flow of $CHF_3$: 40 sccm; radio frequency (RF) power: 150 W; reaction chamber pressure: 800 mTorr. The process conditions for etching the GaN buffer layer and AlGaN barrier layer are as follows: gas flow of boron trichloride ($BCl_3$): 100 sccm; RF power: 60 W; and reaction chamber pressure: 80 mTorr.

The above content is a further detailed description of the present disclosure in conjunction with specific preferred embodiments, and it cannot be considered that the specific implementation of the present disclosure is limited to these descriptions. For the persons skilled in the art, without departing from the concept of the present disclosure, several simple deductions or substitutions can be made, and they should all be regarded as belonging to the protection scope of the present disclosure.

What is claimed is:

1. A gallium nitride (GaN) diode, comprising:
   an anode that includes a stack of metals of tungsten (W) or molybdenum (Mo) and gold (Au) each with a same crystal orientation the metal of W or Mo having a thickness of 20-120 nanometers (nm) and the Au having a thickness of 100-200 nm;

a plurality of layers that include a substrate layer, a GaN buffer layer, a GaN channel layer and an aluminum gallium nitride (AlGaN) barrier layer which are arranged in sequence relative to each other;

a cathode arranged on the AlGaN barrier layer, wherein the cathode includes a stack of metals of titanium (Ti), aluminum (Al), nickel (Ni) and gold (Au);

a groove arranged in the GaN channel layer and the AlGaN barrier layer, the anode being provided on a bottom and a side wall of the groove and part of the AlGaN barrier layer;

a dielectric layer provided on an uncovered portion of the AlGaN barrier layer that is not covered by the cathode and the anode, wherein, a contact portion of the anode with the groove and the AlGaN barrier layer is the metal of W or Mo.

2. The GaN diode according to claim 1, wherein the bottom of the groove is located 2-20 nanometers (nm) below an interface between the AlGaN barrier layer and the GaN channel layer.

3. The GaN diode according to claim 1, wherein the dielectric layer is a silicon dioxide (SiO2) dielectric layer with a thickness of 100-300 nm.

* * * * *